(12) United States Patent
Nihashi et al.

(10) Patent No.: US 9,431,570 B2
(45) Date of Patent: *Aug. 30, 2016

(54) PROCESS FOR PRODUCING LAYERED MEMBER AND LAYERED MEMBER

(71) Applicant: HAMAMATSU PHOTONICS K.K., Hamamatsu-shi, Shizuoka (JP)

(72) Inventors: Tokuaki Nihashi, Hamamatsu (JP); Masatomo Sumiya, Tsukuba (JP); Minoru Hagino, Hamamatsu (JP); Shunro Fuke, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 14 days.

This patent is subject to a terminal disclaimer.

(21) Appl. No.: 14/529,575

(22) Filed: Oct. 31, 2014

(65) Prior Publication Data

US 2015/0050770 A1    Feb. 19, 2015

Related U.S. Application Data

(60) Continuation of application No. 12/761,898, filed on Apr. 16, 2010, now Pat. No. 8,888,914, which is a division of application No. 10/592,325, filed as application No. PCT/JP2005/003879 on Mar. 7, 2005, now abandoned.

(30) Foreign Application Priority Data

Mar. 12, 2004   (JP) ................................ 2004-071011

(51) Int. Cl.
  *C30B 25/02* (2006.01)
  *H01L 31/18* (2006.01)
  (Continued)

(52) U.S. Cl.
  CPC ......... *H01L 31/1856* (2013.01); *C30B 29/403* (2013.01); *H01J 1/34* (2013.01);
  (Continued)

(58) Field of Classification Search
  CPC ........... C30B 29/403; H01J 9/12; H01J 1/34; H01J 40/06
  USPC ......... 117/101, 84, 88, 90, 94, 97, 106, 902, 117/915, 952
  See application file for complete search history.

(56) References Cited

U.S. PATENT DOCUMENTS 6,071,795 A    6/2000  Cheung et al.
6,328,796 B1   12/2001 Kub et al.
(Continued)

FOREIGN PATENT DOCUMENTS

EP    1385215    1/2004
JP    8-96705    4/1996
(Continued)

OTHER PUBLICATIONS

Liu et al. "Substrates for Gallium Nitride Epitaxy". Materials Science and Engineering Reports, 37, (2002) pp. 61-127.
(Continued)

*Primary Examiner* — Matthew Song
(74) *Attorney, Agent, or Firm* — Drinker Biddle & Reath LLP

(57) ABSTRACT

The object is to provide a photoelectric surface member which allows higher quantum efficiency. In order to achieve this object, a photoelectric surface member 1*a* is a crystalline layer formed by a nitride type semiconductor material, and comprises a nitride semiconductor crystal layer 10 where the direction from the first surface 101 to the second surface 102 is the negative c polar direction of the crystal, an adhesive layer 12 formed along the first surface 101 of the nitride semiconductor crystal layer 10, and a glass substrate 14 which is adhesively fixed to the adhesive layer 12 such that the adhesive layer 12 is located between the glass substrate 14 and the nitride semiconductor crystal layer 10.

11 Claims, 5 Drawing Sheets

(51) Int. Cl.
*C30B 29/40* (2006.01)
*H01J 1/34* (2006.01)
*H01J 9/12* (2006.01)
*H01J 40/06* (2006.01)

(52) U.S. Cl.
CPC ............... *H01J 9/12* (2013.01); *H01J 40/06* (2013.01); *H01L 31/1848* (2013.01); *H01L 31/1852* (2013.01); *Y10S 117/902* (2013.01); *Y10S 117/915* (2013.01)

(56) References Cited

U.S. PATENT DOCUMENTS

| | | | |
|---|---|---|---|
| 6,447,604 | B1 | 9/2002 | Flynn et al. |
| 6,580,215 | B2 | 6/2003 | Nihashi |
| 8,888,914 | B2 * | 11/2014 | Nihashi ............ C30B 29/403 117/101 |
| 2001/0024837 | A1 | 9/2001 | Streubel |
| 2002/0011599 | A1 | 1/2002 | Motoki et al. |
| 2002/0102819 | A1 | 8/2002 | Tamura et al. |
| 2002/0189532 | A1 | 12/2002 | Motoki et al. |
| 2003/0064535 | A1 | 4/2003 | Kub et al. |
| 2003/0151348 | A1 | 8/2003 | Tiberi |
| 2004/0012337 | A1 | 1/2004 | Oohata et al. |
| 2004/0107891 | A1 | 6/2004 | Nagai et al. |
| 2004/0209402 | A1 | 10/2004 | Chai et al. |
| 2005/0052092 | A1 | 3/2005 | Laermer |
| 2007/0001226 | A1 | 1/2007 | Takahashi |

FOREIGN PATENT DOCUMENTS

| | | |
|---|---|---|
| JP | 10-241554 | 9/1998 |
| JP | 11-68157 | 3/1999 |
| JP | 2000-11856 | 1/2000 |
| JP | 2002-75871 | 3/2002 |
| JP | 2002-241198 | 8/2002 |
| JP | 2002-348199 | 12/2002 |
| WO | WO 03/037782 | 5/2003 |
| WO | WO 03/107386 | 12/2003 |

OTHER PUBLICATIONS

Yamaguchi et al. "Influence of AlN growth Conditions on the polarity of GaN growth on AlN/Si(111) by MOMBE" Japanese Journal of Applied Physics, Vo. 43, No. 2A, 2004, pp. L151-L153.
Machuca et al. "Oxygen species in Cs/O activated gallium nitride (GaN) Negative electron affinity photocathodes", J. Vac. Sci. Technol. B vol. 21, Issue 4, pp. 1863-1869 (Jul. 2003).
Yang et al. "Photoelectron emission microscopy observation of inversion domain boundaries of GaN-based lateral polarity heterostructures" Journal of Applied Physics, vol. 94, No. 9, pp. 5720-5725, (Nov. 2003).
Patent Abstracts of Japan, English Abstract and computer translation of JP 11068157 A (2013).
Yoshinao Kumagai, et al., "Investigation of Substrate Orientation Dependence for the Growth of GaN on GaAs (111)A and (111)B Surfaces by Metalorganic Hydrogen Chloride Vapor-Phase Epitaxy," Jpn. J. Appl. Phys., vol. 39 (2000); Feb. 15, 2000, pp. 149-151, XP001011744.
Hisashi, Murakami, et al., "Influence of Substrate Polarity on the Low-Temperature GaN Buffer Layer Growth on GaAs (111)A and (111)B Surfaces," Journal of Crystal Growth, 247 (2003), pp. 245-250, XP004398150.
Wikipedia, "Metalorganic Vapour Phase Epitaxy," Apr. 26, 2015, 3 pages as attached, XP55211521.
Jeong Wook Lee, et al., "Effect of Buffer Layer on the Growth of GaN on Si Substrate," Journal of Crystal Growth 237-239, (2002), pp. 1094-1098, XP004355945.

* cited by examiner

Fig.3

| SUBSTRATE FOR CRYSTAL GROWTH | | BUFFER LAYER | ACTIVE LAYER | ELECTRON STOPPING LAYER |
|---|---|---|---|---|
| MATERIAL | SURFACE ORIENTATION | | | |
| Si | (111) | AlN<br>AlN/GaN SUPERLATTICE | GaN<br>AlGaN<br>InGaN | AlN<br>AlGaN<br>BGaN |
| GaAs | (111)A | InGaAsN | | |
| GaP | (111)A | InGaPN | | |

PROCESS FOR PRODUCING LAYERED MEMBER AND LAYERED MEMBER

This is a continuation application of copending application Ser. No. 12/761,898, having a filing date of Apr. 16, 2010, which is a divisional application of application Ser. No. 10/592,325, now abandoned, having a §371 date of Jun. 21, 2007, which is a national stage filing based on PCT International Application No. PCT/JP2005/003879, filed on Mar. 7, 2005. The application Ser. No. 12/761,898, which is now U.S. Pat. No. 8,888,914 and application Ser. No. 10/592,325, which is now abandoned, are incorporated by reference herein in their entireties.

TECHNICAL FIELD

The present invention relates to a layered member and a manufacturing method for a layered member comprising a layer formed by a nitride type semiconductor material.

BACKGROUND ART

An example of a layered member comprising a layer formed by a nitride type semiconductor material is a photoelectric surface comprising a GaN layer as an active layer (for instance, see cited patent 1).
Cited patent 1: Japanese Patent Application Laid-open No. H10-241554.

DISCLOSURE OF THE INVENTION

Problems to be Solved by the Invention

With a conventional photoelectric surface, the quantum efficiency when an excited photoelectron is emitted by light entering a nitride semiconductor crystalline layer as a light absorbing layer has been increasing, but even higher quantum efficiency and lower cost are being demanded for photoelectric surfaces.

An object of the present invention is to provide a layered member and a manufacturing method for a layered member which can further increase quantum efficiency and achieved lower costs.

Means for Solving the Problems

In order to achieve the aforementioned object, the present inventors have performed evaluations from many aspects. For material costs and productivity, sapphire substrates have a high material cost, and an extremely long time is required when mechanically processing so the price becomes even higher. In contrast, silicon substrates with high quality are supplied at low cost in large sheets. Furthermore, using a glass bonding method, the productivity of the photoelectric surface process is excellent compared to sapphire substrates. Recently, the market has been demanding lower prices as well as demanding higher performance. From this point of view, there is demand to satisfy both of these requirements. Therefore the present inventors first focused attention to the polarization of nitride type semiconductor materials. Nitride type semiconductor materials have material specific polarization properties which include spontaneous polarization along the c axis of the crystal and piezo polarization. To illustrate, if these polarization properties are used in a photoelectric surface such as a photoelectron multiplier tube or the like, the positive charge will increase above the surface level because of polarization, and therefore strong band bending will occur at the surface. Therefore the quantum efficiency of the active layer is increased by utilizing the surface emission of the photoelectrons. Furthermore, by widening the depleted layer, a built-in field and active layer will be formed and the diffusion length will be extended.

However, in order to utilize this polarization, the topmost layer of the photoelectric surface must be a −c surface (surface in the negative c polar direction, N surface direction) and a very smooth surface must be achieved. However, with the MOCVD growth method used for normal sapphire substrates (surface orientation of main surface is (0001)c), the +c plane (plane in the positive c polar direction, plane in the Group III element surface direction) will be the growth direction. With this crystal growth method, the growth of the −c surface is difficult to control and a highly smooth surface can not be obtained.

As a result of further investigations into this point by the present inventors, the following finding was made. Namely, when a wafer is obtained using this crystal growth method, the surface on the opposite side of the +c polar direction (hereinafter, +c surface) is the −c polar direction surface (hereinafter, −c surface). Furthermore, it was discovered that the plane orientation of the crystal growth substrate used to grow the nitride type semiconductor material also has an effect of achieving a smooth surface. The present invention was achieved based on these findings.

The manufacturing method of the layered member of the present invention comprises the steps of: preparing a substrate for crystal growth which is a crystalline substance with the main surface in the (111) plane orientation; forming a buffer layer along the main surface of the substrate for crystal growth; forming a nitride semiconductor crystal layer on the buffer layer by crystal growth in the Group III element surface (positive c polar) direction using a nitride type semiconductor material; forming an adhesive layer on the nitride semiconductor crystal layer; adhesively fixing the substrates onto the adhesive layer; and removing the substrate for crystal growth to obtain the buffer layer with a negative c polar surface.

With the layered member manufacturing method of the present invention, the plane orientation is (111) for the main surface of the substrate for crystal growth which forms a nitride semiconductor crystal layer by crystal growth through a buffer layer, so the surface of the substrate side for growing crystals of the nitride type semiconductor material can be the −c layer. Furthermore, the substrate for growing crystals is removed after the nitride semiconductor crystal layer and the substrate are adhesively fixed together by an adhesive layer so the −c surface of the buffer layer can be the topmost surface layer.

Furthermore, the layered member manufacturing method of the present invention preferably further comprises, after the step of removing the substrate for crystal growth, a step of removing the buffer layer to obtain a nitride semiconductor crystal layer which has a negative c polar surface. The buffer layer is removed, so the −c layer of the nitride semiconductor crystal layer can be the topmost surface layer.

Furthermore, the layered member manufacturing method of the present invention preferably further comprises, after the step of removing the substrate for crystal growth, a step of causing crystal growth of the semiconductor material on the negative c polar surface of the buffer layer. Crystal growth will occur on the negative c polar surface so favorable crystal growth is possible.

Furthermore, the layered member manufacturing method of the present invention preferably further comprises, after the step of removing the buffer layer, a step of causing crystal growth of the semiconductor material on the negative c polar surface of the nitride semiconductor crystal layer. Crystal growth will occur on the negative c polar surface so favorable crystal growth is possible.

Furthermore, the layered member manufacturing method of the present invention preferably further comprises, prior to the step of removing the substrate for crystal growth, a step of forming a protective layer which covers at least the periphery of the substrate. The periphery of the substrate will be covered by a protective layer, and therefore, when removing the buffer layer and the substrate for forming crystals by etching, for instance, erosion of the substrate can be reduced.

The layered member of the present invention is comprising a nitride semiconductor crystal layer which is a crystalline layer formed by a nitride type semiconductor material and in which the direction from the first surface thereof to the second surface thereof is the N surface (negative c polar) direction of the crystal; an adhesive layer formed along the first surface of the nitride semiconductor crystal layer; and a substrate which is adhesively fixed to the adhesive layer such that the adhesive layer is located between the substrates and the nitride semiconductor crystal layer.

With the layered member of the present invention, the direction from the first surface to the second surface of the nitride semiconductor crystal layer is the negative c polar direction, so the second surface will be the −c surface.

Furthermore, with the layered member of the present invention, the first surface is an incidence plane where the light enters, the second surface is an emission plane which emits the photoelectron, and the substrate is a glass substrate formed to transmit light, and the layered member is preferably used as a photoelectric surface member which emits photoelectrons which have been excited by incident light. The second surface is the emission plane, so the emission plane of the photoelectric surface member can be the −c surface.

With the present invention, a layered member can be produced where the topmost layer is the −c surface. Therefore, a layered member and a manufacturing method for a layered member which can have even higher quantum efficiency can be provided.

BRIEF DESCRIPTION OF THE DRAWINGS

FIG. 3 is a diagram for describing the materials used in manufacturing the photoelectric surface member which is an embodiment of the present invention;

DESCRIPTION OF THE SYMBOLS

Figure 1:
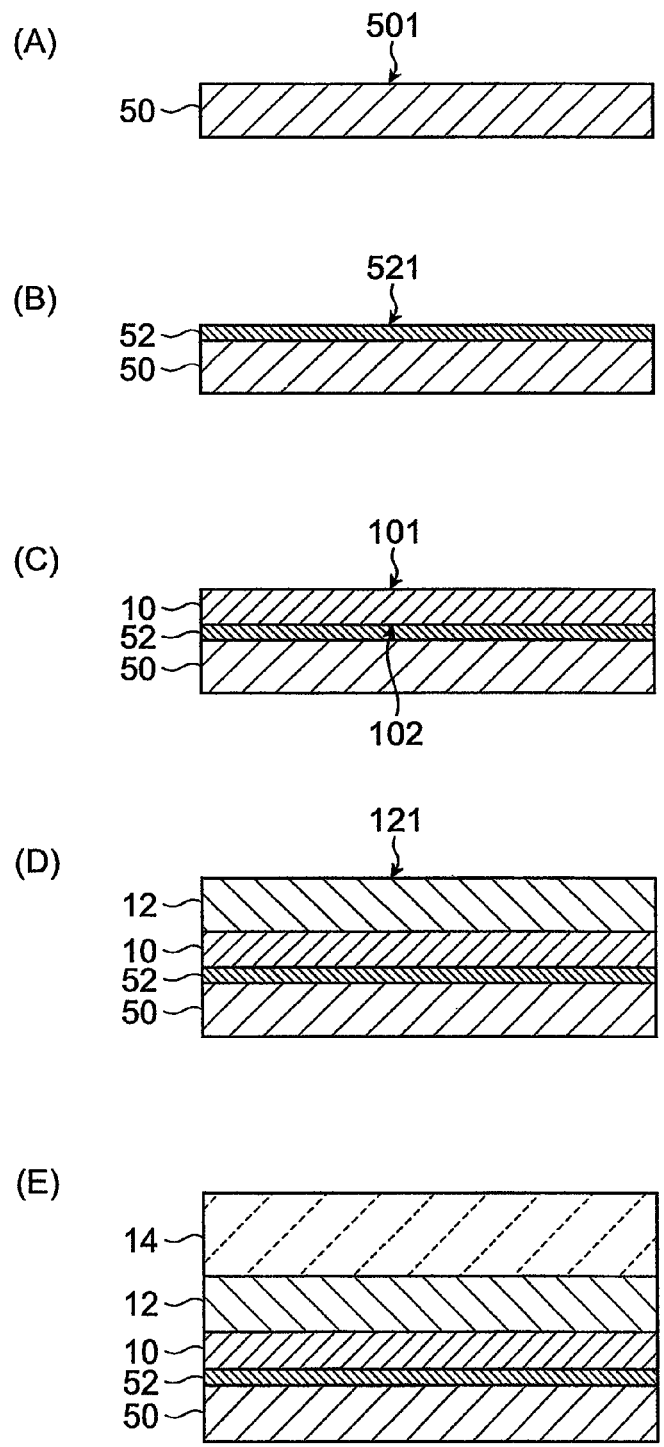
FIG. 1 is a diagram for describing the manufacturing method of a photoelectric surface member which is an embodiment of the present invention.
Figure 2:
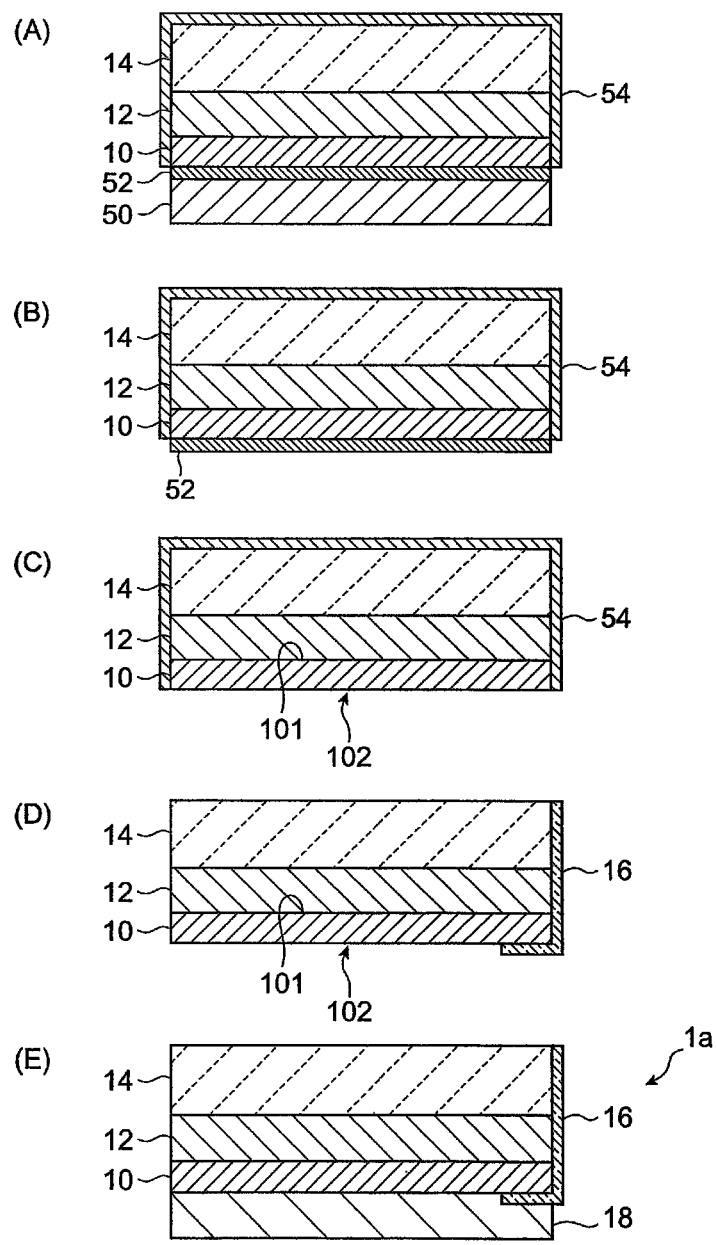
FIG. 2 is a diagram for describing the manufacturing method of a photoelectric surface member which is an embodiment of the present invention.

1a—photoelectric surface member, 10—nitride semiconductor crystal layer, 12—adhesive layer, 14—glass substrate, 16—cathode electrode, 18–Cs—O layer.

BEST MODE FOR CARRYING OUT THE INVENTION

The findings of the present invention can easily be understood by considering the following detailed description while referring to the attached drawings which are shown only as examples. Continuing, the best mode for carrying out the present invention will be described while referring to the attached drawings. Where possible, the same code has been attached to the same parts and duplicate descriptions have been omitted. Furthermore, the scale of the dimensions in the drawings do not necessarily match that of the descriptions.

The manufacturing method of the photoelectric surface material which is an embodiment of the present invention will be described while referring to FIG. 1A-E and FIG. 2A-E. FIG. 1 A-E and FIG. 2 A-E are cross-section diagrams for describing the manufacturing steps of the photoelectric surface member.

First, a silicon (111) substrate was prepared as the substrate 50 for crystal growth (see FIG. 1A). The substrate 50 for crystal growth which is a silicon (111) substrate is a crystalline material and the surface orientation of the main surface 501 is (111). $Al_xGa_{1-x}N$ ($0<X\leq1$) is grown to approximately several tens of nanometers, and buffer layer 52 is formed on the main surface 501 of the silicon (111) substrate 50 (see FIG. 1B).

A nitride semiconductor crystal layer 10 with a thickness of approximately several hundred nanometers is formed on the main surface 521 of the buffer layer 52 by epitaxial growth using a Group III-V nitride semiconductor gas material comprising Ga and N (see FIG. 1C). The nitride semiconductor crystal layer 10 is doped with magnesium to a level between approximately E19 and E20. As has already been described, the surface orientation of the main surface 501 of the substrate 50 for crystal growth is (111), so the first surface 101 of the nitride semiconductor crystal layer 10 is the +c surface, and the second surface 102 is the −c surface.

A layer of silicon dioxide was overlaid with a thickness of between 100 and 200 nm on to the first surface 101 of the nitride semiconductor crystal layer 10 using the CVD method to form the adhesive layer 12 (see FIG. 1D). Next, the glass substrate 14 was prepared. The glass substrate 14 preferably has a thermal expansion coefficient similar to the thermal expansion coefficient of the substrate 50 for crystal growth, and preferably contains prescribed alkali ion elements. Corning's 9741 and Schott's 8337B are examples of these types of glass substrates 14.

After cleaning the glass substrate 14, the glass substrate 14 and a multilayered sheet with the configuration shown in FIG. 1D (substrate 50 for crystal growth, buffer layer 52, nitride semiconductor crystal layer 10, and adhesive layer 12 successively overlaid) were rapidly heated to the glass softening point while the main surface 121 of the adhesive layer 12 was brought into contact with the glass substrate 14. At this time, a prescribed loading was applied, and the multilayered sheet and the glass substrate 14 were thermocompression bonded through the adhesive layer 12 (see FIG. 1E).

In the condition shown in FIG. 1E, at least the glass substrate 14 was covered by an adhesive Teflon sheet 54 (see FIG. 2A). Next, etching was performed at room temperature using (1 HF+1 $HNO_3$+1 $CH_3COOH$) as the etchant. The substrate 50 for crystal growth was etched by this etching process, and the etching was stopped by the buffer layer 52 (see FIG. 2B). Therefore, the buffer layer 52 acted as the stopping layer.

Next, etching was performed using (1 KOH+10 H$_2$O+ 0.01 H$_2$O$_2$) as the etchant to remove the buffer layer 52 (see FIG. 2C). Normally, the etching speed of +c surface AlN and GaN is extremely slow, but with this embodiment, the −c surface side is etched so etching can be performed using the aforementioned etchants. Note, the timing to complete the etching of the buffer layer 52 is determined by the elapsed time, the confirmation results of the flatness of the second surface 102 of the nitride semiconductor crystal layer 10, and the transmissivity or the like of the nitride semiconductor crystal layer 10.

When etching of the buffer layer 52 was complete, the adhesive Teflon sheet 54 was removed. Next, a cathode electrode 16 was formed by the vapor deposition from the glass substrate 14 to the second surface 102 of the nitride semiconductor crystal layer 10 (see FIG. 2D). Cr, Al, and Ni or the like may be used as the material of the cathode electrode.

Finally, after cleaning the second surface 102 of the nitride semiconductor crystal layer 10, a Cs—O layer 18 was formed on the second layer 102 to obtain a photoelectric surface member 1*a* (FIG. 2E). Note, any one or combination of Cs—I, Cs—Te, or Sb—Cs or the like may be used as a layer containing alkali metal in place of the Cs—O layer 18.

In the aforementioned process, the buffer layer 52 surface obtained by removing the substrate 50 for crystal growth was a flat −c polar surface. Using this −c polar surface as a substrate for crystal growth (re-growth substrate), various devices with excellent characteristics which use semiconductor materials can be manufactured by growing one or more layers of high quality semiconductor crystals such as Al$_x$Ga$_{1-x}$N (0≤X≤1) on the buffer layer 52.

Furthermore, the surface of the nitride semiconductor crystal layer 10 obtained after removing the buffer layer 52 has a flat −c polar surface. The aforementioned manufacturing process was described as a process for manufacturing a photoelectric surface, but if this nitride semiconductor crystal layer 10 is used as a substrate for crystal growth (regrowth substrate), various devices with excellent characteristics which use semiconductor materials can be manufactured by growing one or more layers of high quality semiconductor crystals such as Al$_x$Ga$_{1-x}$N (0≤X≤1) or InN or the like.

Note, the materials used for the layers and substrates are not restricted to those described above. FIG. 3 shows an example of a material which enables nitride semiconductor crystal layer 10 +c surface growth and flattening of the nitride semiconductor crystal layer 10 second surface 102. In the example shown in FIG. 3, if the material of the substrate 50 for crystal growth is silicon and the surface orientation is (111), AlN or AlN/GaN superlattice is preferably used as the buffer layer 52 material, and GaN, AlGaN, or InGaN is preferably used as the material of the nitride semiconductor crystal layer 10. Furthermore, if the material of the substrate 50 for crystal growth is GaAs and the surface orientation is (111)A, InGaAsN is preferably used as the material of the buffer layer 52, and GaN, AlGaN, or InGaN is preferably used as the material for the nitride semiconductor crystal layer 10. Furthermore, if the material of the substrate 50 for crystal growth is GaP and the surface orientation is (111)A, InGaPN is preferably used as the material for the buffer layer 52 and GaN, AlGaN, or InGaN is preferably used as the material for the nitride semiconductor crystal layer 10. Furthermore, in order to increase the quantum efficiency of the photoelectron surface for any of these cases, a step of forming an electron stopping layer 10 with a larger bandgap after the step of forming the crystal layer is preferable. This is because a potential barrier is formed on the opposite side to the vacuum surface of the nitride semiconductor crystal layer, and, of the photoelectrons generated, the photoelectrons moving towards the opposite direction to the vacuum escape surface direction are repelled to the opposite direction, and therefore photoelectrons move towards the vacuum escape surface direction. The material in this case is preferably AlN, AlGAN, or BGaN.

The effect of this embodiment will be described. With the manufacturing method of this embodiment, the surface orientation will be (111) for the main surface 501 of the substrate 50 for crystal growth for forming a nitride semiconductor crystal layer 10 using crystal growth through a buffer layer 52, and therefore the surface of the substrate 50 for crystal growth side of the nitride semiconductor crystal layer 10 can be a −c surface. Furthermore, after adhesively fixing the nitride semiconductor crystal layer 10 and the glass substrate 14 through the adhesive layer 12, the substrate 50 for crystal growth and the buffer layer 52 are removed, so the −c surface of the nitride semiconductor crystal layer 10 can be the second surface 102 which is the topmost layer.

Figure 4:
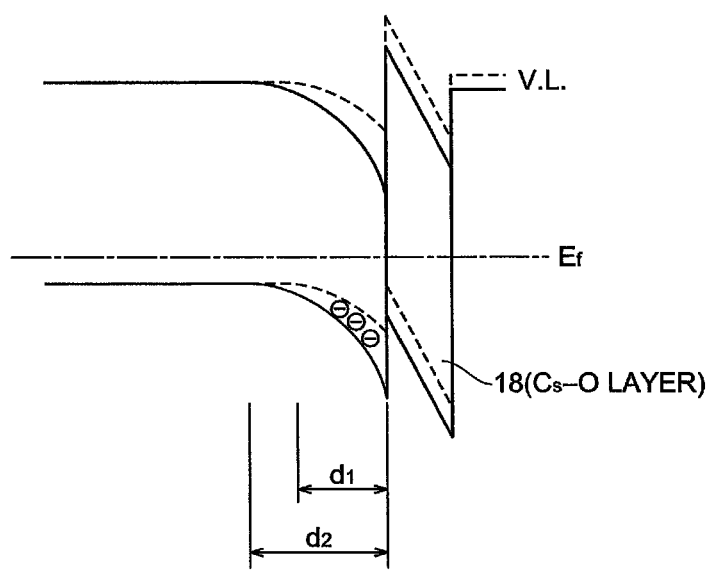
FIG. 4 is a diagram for describing the effect of the photoelectric surface member which is an embodiment of the present invention.
Figure 5:
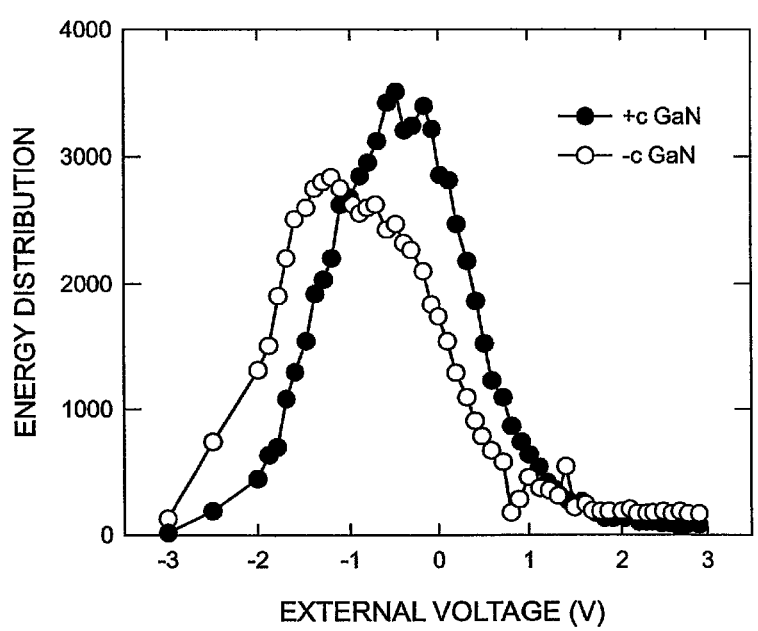
FIG. 5 shows the energy distribution properties for p type +c and −c GaN.

The effect of making the topmost layer of the nitride semiconductor crystal layer 10 or in other words the second surface 102 (surface which emits photoelectrons) to be the −c surface will be described while referring to FIG. 4 and FIG. 5. FIG. 4 is a bandgap diagram for a photoelectric surface, and the broken line shows the case where the topmost layer is the +c surface, and the solid line shows the case where the topmost layer is the −c surface. Generally, the surface energy band of a p type semiconductor curve downward. To this is added the effect of spontaneous polarization and piezo polarization. This polarization effect is reversed depending on whether the surface is the +c surface or the −c surface, and the latter case acts effectively. In other words, if the N surface (−c surface) is the electron emission plane, the polarity direction will change from bulk towards the emission plane with both polarizations (spontaneous polarization and piezo polarization) (fixed electric charge of the polarity but the emission plane side is positive). In order to block this, the density of the acceptors which undergo electron disassociation near the surface is increased, the depletion layer is widened, and the downward facing curve effect will increase as shown by the solid line in FIG. 4. As a result, the vacuum level will be lowered by that amount so the photoelectrons can more easily escape and the quantum efficiency of the photoelectric surface will be increased. Furthermore, because of the widening of the depletion layer, a built-in field will be formed in the nitride semiconductor crystal layer, and the diffusion length will increase ($d_1$ and $d_2$ in FIG. 4). Therefore, electrons in the deep location can reach the surface and escape. As shown in FIG. 5, the energy distribution properties determined from the relationship of the electron current to the applied voltage show that the high-energy component of the −cGaN is higher than that of +cGaN, and the acceleration effect due to polarization is also shown. As a result, electrons which have energy above the vacuum level (V.L.) of the surface are increased, and the number of photoelectrons which can escape will be higher.

The invention claimed is:

1. A photoelectric surface member manufacturing method of manufacturing a photoelectric surface member for forming a photoelectric surface which emits photoelectrons excited by incident light, comprising the steps of:
   preparing a substrate for crystal growth which is a crystalline substance with the main surface in a predetermined plane orientation;

forming a buffer layer along the main surface of said substrate for crystal growth;

forming a nitride semiconductor crystal layer as a light absorbing layer on said buffer layer by crystal growth in the Group III element surface (positive c polar) direction using a Group III-V nitride type semiconductor material so that a surface of the nitride semiconductor crystal layer of the buffer layer side is a second surface which is a negative c polar surface;

forming an adhesive layer on a first surface which is a positive c polar surface of said nitride semiconductor crystal layer;

adhesively fixing a glass substrate which is formed to transmit incident light onto said adhesive layer;

removing said substrate for crystal growth to obtain said buffer layer;

removing said buffer layer to obtain said nitride semiconductor crystal layer having the second surface which is the negative c polar surface after the step of removing said substrate for crystal growth; and forming a layer containing alkali metal on the second surface of said nitride semiconductor crystal layer, wherein in said nitride semiconductor crystal layer, the first surface is an incidence surface where the light transmitted through the glass substrate enters, and the second surface is an emission surface which emits photoelectrons excited by the incident light through the layer containing alkali metal.

2. The manufacturing method according to claim 1, further comprising, prior to the step of removing the substrate for crystal growth, a step of forming a protective layer which covers at least the periphery of said glass substrate.

3. The manufacturing method according to claim 1, wherein the substrate for crystal growth is a Si substrate with the predetermined plane orientation.

4. The manufacturing method according to claim 3, wherein the buffer layer is an AlN layer, or an AlN/GaN superlattice layer.

5. The manufacturing method according to claim 1, wherein the substrate for crystal growth is a GaAs substrate with the predetermined plane orientation.

6. The manufacturing method according to claim 5, wherein the buffer layer is an InGaAsN layer.

7. The manufacturing method according to claim 1, wherein the substrate for crystal growth is a GaP substrate with the predetermined plane orientation.

8. The manufacturing method according to claim 7, wherein the buffer layer is an InGaPN layer.

9. The manufacturing method according to claim 1, wherein the nitride semiconductor crystal layer is a GaN layer, an AlGaN layer, or an InGaN layer.

10. The manufacturing method according to claim 1, further comprising, after the step of forming the nitride semiconductor crystal layer, a step of forming an electron stopping layer with a bandgap larger than that of the nitride semiconductor crystal layer.

11. The manufacturing method according to claim 10, wherein the electron stopping layer is an AlN layer, an AlGaN layer, or a BGaN layer.

* * * * *